United States Patent
Weber et al.

(10) Patent No.: US 6,271,655 B1
(45) Date of Patent: Aug. 7, 2001

(54) PLANAR COIL DEVICE, METHOD AND SYSTEM FOR SENSING CHANGING CURRENTS IN A PLANAR CONDUCTOR PATH

(75) Inventors: Rupert Weber, Schneeberg; Reinhard Cohrs; Eberhard Hoefflin, both of Erbach, all of (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/122,446

(22) Filed: Jul. 24, 1998

(30) Foreign Application Priority Data

Jul. 24, 1997 (DE) ............................................. 197 31 790

(51) Int. Cl.[7] ....................... G01R 19/00; G01R 19/165; G01R 31/02; H01F 5/00; H02H 3/08
(52) U.S. Cl. ..................... 324/117 R; 324/127; 324/511; 219/130.21; 336/200; 361/93.6; 363/50
(58) Field of Search ............................... 324/117 R, 126, 324/127, 509–511, 543, 750, 239–243, 529, 537; 323/358; 336/173, 200; 340/664; 361/57, 93.1, 93.5, 93.6; 363/50; 219/130.21, 130.31, 130.33

(56) References Cited

U.S. PATENT DOCUMENTS

| | | | |
|---|---|---|---|
| 3,465,274 | * | 9/1969 | Proctor .............................. 336/200 X |
| 4,894,610 | * | 1/1990 | Friedl ........................... 324/117 R X |
| 5,389,876 | * | 2/1995 | Hedengren et al. .................. 324/242 |
| 5,430,424 | * | 7/1995 | Sato et al. ............................. 336/200 |
| 5,594,332 | * | 1/1997 | Harman et al. ....................... 324/127 |
| 5,694,030 | * | 12/1997 | Sato et al. ........................ 336/200 X |
| 5,963,038 | * | 10/1999 | De Jong et al. ................. 324/127 X |

\* cited by examiner

Primary Examiner—Gerard R. Strecker
(74) Attorney, Agent, or Firm—Kenyon & Kenyon

(57) ABSTRACT

A device for sensing an alternating current includes a circuit board on whose surface is arranged a planar conductor path in which a current to be measured flows. Applied on the opposite surface of the conductor path is a planar coil in which the change in the current to be measured induces a voltage. The device is advantageously used in a converter having a direct-current voltage link circuit.

23 Claims, 2 Drawing Sheets

PLANAR COIL DEVICE, METHOD AND SYSTEM FOR SENSING CHANGING CURRENTS IN A PLANAR CONDUCTOR PATH

BACKGROUND INFORMATION

Conventional devices consist of a current-carrying conductor around which a coil is arranged. An alternating current flowing in the conductor induces in the coil a voltage which is proportional to the change over time in the current. Suitable analysis of the induced voltage yields information concerning the current flowing in the conductor. Devices which perform this type of current measurement are available commercially as complete components, and can easily be integrated into electronic circuits. All that is needed to be provided for the purpose is one connection for the current to be measured, as well as a further connection to lead the measured signal out. Unsatisfactory aspects of such conventional current measurement components are their comparatively large space requirement which limits the miniaturization of circuits, and their high price due to their embodiment as a sealed subassembly.

One of the objects of the present invention is to provide a current measurement device which requires as little installation space as possible and is also economical.

SUMMARY OF THE INVENTION

According to the present invention, the sensing device is configured in planar fashion on the surfaces of a circuit board, and requires no installation depth. Production of the actual measurement arrangement is accomplished by configuring a conductive path structure, and is thus extraordinarily economical. One of the advantages of the sensing device according to the present invention is that additional actions for galvanic separation of the current-carrying conductor and the measurement arrangement are not necessary. Manufacture is thereby made simpler and more flexible. The configuration as a conductive path structure also offers the advantages of conductive paths in terms of thermal insensitivity, contact reliability, insensitivity to mechanical damage, and good reproducibility of the mechanical arrangement.

DETAILED DESCRIPTION

Figure 1:
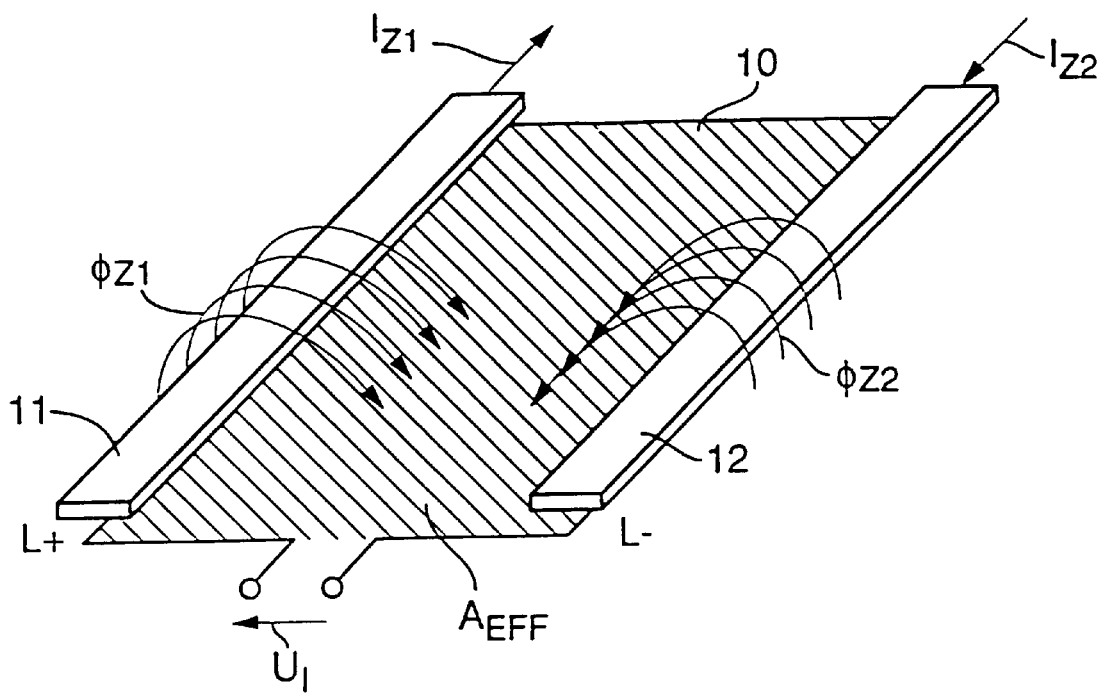
FIG. 1 shows a basic sensing principle for a sensing device according to the present invention.

FIG. 1 illustrates the physical principle underlying the sensing device according to the present invention. Alternating currents $I_{Z1}$, $I_{Z2}$, which carry along with them respective magnetic fields $\Phi_{Z1}$, $\Phi_{Z2}$ surrounding conductors 11, 12, flow in opposite directions through the respective conductors. A conductor loop 10 is located beneath conductors 11, 12 in such a way that magnetic fields $\Phi_{Z1}$, $\Phi_{Z2}$ penetrate conductor loop 10. A change in magnetic fields $\Phi_{Z1}$, $\Phi_{Z2}$ resulting from a change in currents $I_{Z1}$, $I_{Z2}$ induces in conductor loop 10 a voltage $U_I$ which is an indication of the alternating current flowing in conductors 11, 12.

Figure 2:
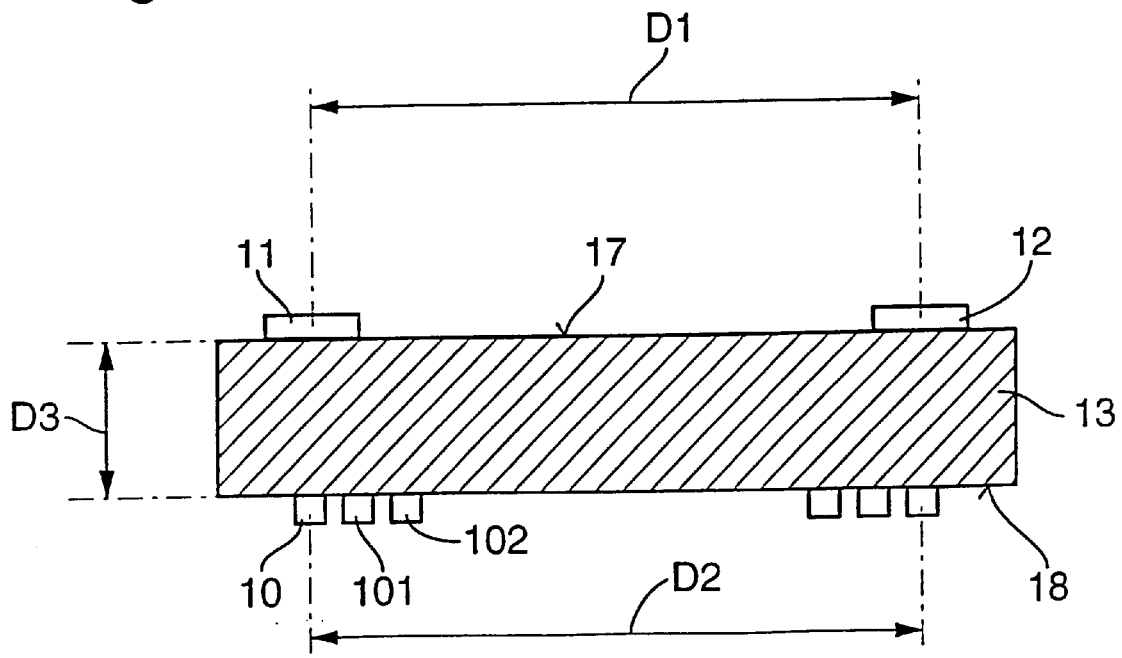
FIG. 2 shows a cross section through the sensing device.

FIG. 2 shows a cross section through a sensing device utilizing the principle described above with respect to FIG. 1. Two conductive paths (e.g., conductors) 11 and 12 are applied at a spacing D1 from one another onto a first surface 17, designated here as the upper side, of a circuit board 13. Applied onto the opposite surface 18, designated here as the lower side, of circuit board 13, is a conductor loop 10. In order to magnify the measured signal, it is wound several times around itself as indicated by turns 101, 102. Outside diameter D2 of conductor loops 10, 101, 102 is matched to spacing D1 of conductive paths 11, 12 on upper side 17 of circuit board 13. It is selected, as a function of spacing D1, in such a way that the turns of conductor loops 10, 101, 102 are reliably penetrated by the magnetic field surrounding conductive paths 11, 12.

Figure 3:
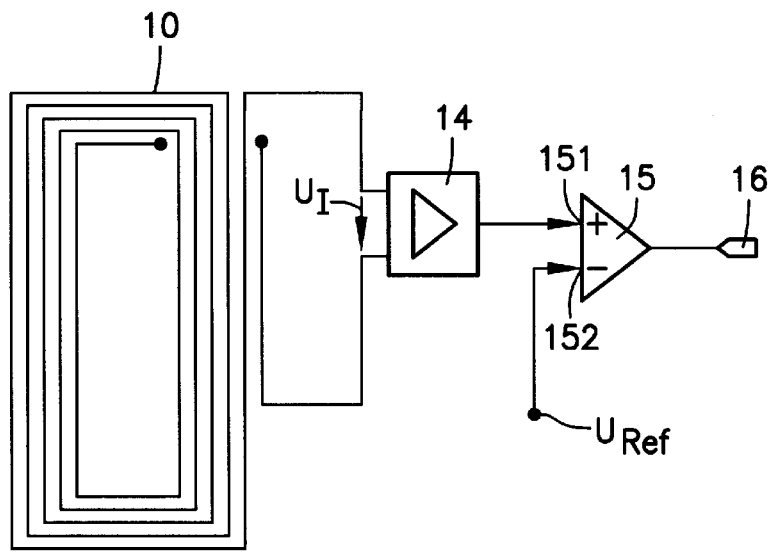
FIG. 3 shows a schematic diagram of a monitoring circuit.

Voltage $U_i$ induced in conductor loop 10 is, as shown in FIG. 3 which reproduces a conductor loop 10 in a plan view, conveyed for amplification to an amplifier 14. The amplified measured signal $U_i$ is conveyed to first input 151 of a comparator 15. Connected to the second input 152 thereof is a reference voltage $U_{ref}$ which corresponds to a maximum value for the current changes $dI_{Z1}/dt$, $dI_{Z2}/dt$ occurring in conductors 11, 12. There is thus present at output 16 a signal which provides information as to whether the current changes $dI_{Z1}/dt$, $dI_{Z2}/dt$ occurring in conductors 11, 12 lie within a predefined normal range or exceed a limit value.

Figure 4:
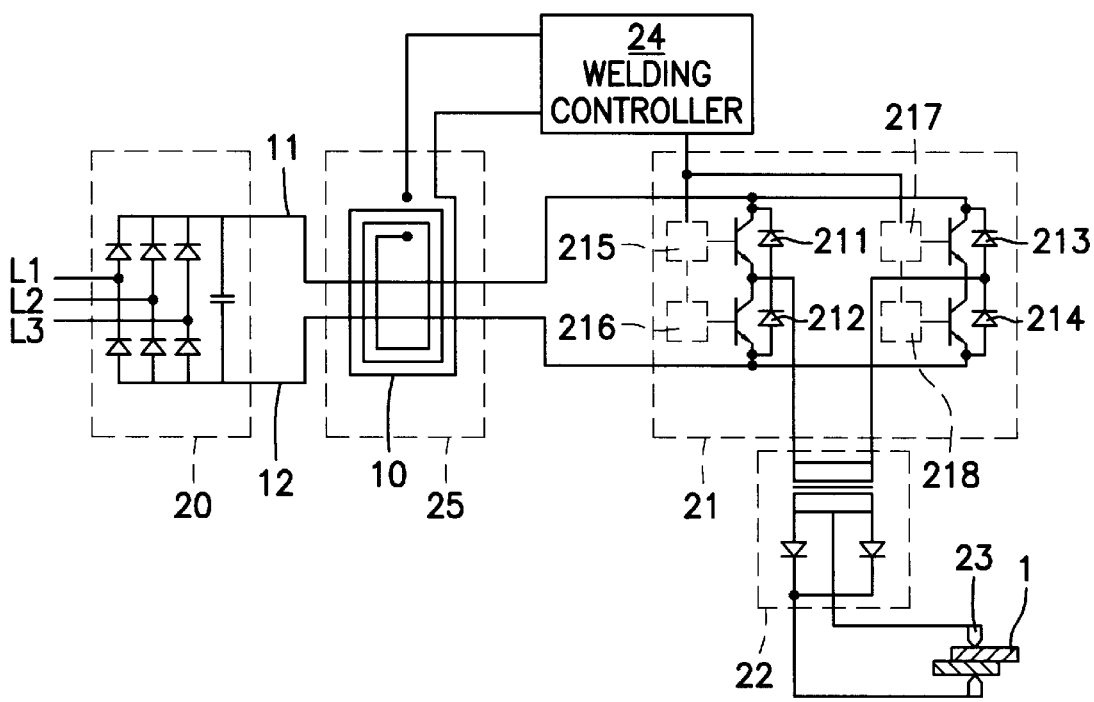
FIG. 4 shows an arrangement utilizing the sensing device in a welding system.

FIG. 4 shows an application of the sensing device described above in a welding system operating according to the frequency converter principle. It shows at its input side a rectifier unit 20 for transferring a three-phase input alternating current L1, L2, L3 into a direct-current link circuit constituted by the two conductors 11, 12. The direct-current voltage present in link circuit (e.g., two conductors) 11, 12 is converted in the downstream inverter 21 back into a high-frequency alternating-current voltage which is then conveyed to a welding transformer unit 22, from which it is applied via welding electrodes 23 onto a workpiece 1 being processed. Four power semiconductor switches 211 through 214, each with associated drivers 215 through 218, are the core of inverter 21. To control power semiconductor switches 211 through 214, drivers 215 through 218 are connected to a welding controller 24. Also connected to welding controller 24 is an inductive conductor loop 10, as described with respect to FIGS. 2 and 3. Conductor loop 10 is located on the upper side of a circuit board 25 on whose lower side, opposite conductor loop 10, conductors 11, 12 forming the link circuit are guided. A circuit as shown in FIG. 3 is located inside welding controller 24. In this application, the purpose of sensing device 10, 11, 12, 24, 25 is to detect the occurrence of overcurrents and, if applicable, bring about deactivation of power semiconductor switches 211 through 214. The overcurrents detected are, in particular, those caused by short circuits in the welding circuit.

The overcurrent monitoring system illustrated in FIG. 4 can be transferred to many other circuits. It is also suitable, in particular, for frequency converter-driven drive arrangements, to detect therein, in timely fashion, overcurrents that may be caused by link circuit short circuits or short circuits in the motor winding or the motor supply lead.

Induction loop 10 supplies a signal of the form dI/dt that is proportional to the change over time in the measured current. If what is desired is to know the value of the current itself, this can easily be implemented by incorporating an integration member into the circuit.

What is claimed is:

1. A device for sensing an alternating current using a coil voltage, comprising:

a circuit board having a first surface and a second surface, the first surface being opposite to the second surface;

at least one planar conductor path arrangement situated on the first surface, the alternating current flowing in the at least one planar conductor path arrangement; and a planar coil situated on the second surface, wherein the coil voltage is induced in the planar coil as a function of a change in the alternating current.

2. The device of claim 1, wherein the at least one planar conductor path arrangement includes two planar conductor path arrangements, wherein the alternating current is a two-phase alternating current, and wherein each of the two planar conductor path arrangements carries one phase of the two-phase alternating current.

3. A converter comprising:

a device including:
- a circuit board having a first surface and a second surface, the first surface being opposite to the second surface, and
- a planar coil situated on the first surface;
- a direct-current voltage link circuit situated on the second surface;
- a rectifier unit for receiving an alternating current and for providing a rectified current to the direct-current voltage link circuit for generating a direct-current voltage, wherein the direct-current voltage is induced in the planar coil as a function of a change in the alternating current; and
- an inverter for generating an alternating-current voltage as a function of the direct-current voltage;

wherein the device detects an overcurrent of the rectified current which flows in the direct-current voltage link circuit.

4. The device of claim 1, wherein an outside spacing of the planar coil is matched to a spacing of two conductor paths of the at least one planar conductor path arrangement.

5. The device of claim 1, wherein an outside spacing of the planar coil is one of the same and about the same as a spacing of two conductor paths of the at least one planar conductor path arrangement.

6. The device of claim 1, wherein the first surface and the second surface are external surfaces.

7. A device for sensing a changing current in a planar conductor path, the device comprising:

an insulating board having a first surface and a second surface, the first surface being opposite to the second surface;

at least one planar conductor path arrangement being provided on the first surface, the changing current flowing in the at least one planar conductor path arrangement; and a planar loop arrangement being provided on the second surface, wherein a loop voltage is induced in the planar loop arrangement based on the changing current.

8. The device of claim 7, wherein an outside spacing of the planar loop arrangement is one of the same and about the same as a spacing of conductor paths of the at least one planar conductor path arrangement.

9. The device of claim 8, wherein a conductor loop of the planar loop arrangement is penetrated by magnetic fields surrounding the conductor paths of the at least one planar conductor path arrangement.

10. The device of claim 8, wherein each conductor loop of the planar loop arrangement is penetrated by magnetic fields surrounding the conductor paths of the at least one planar conductor path arrangement.

11. The device of claim 7, wherein the planar loop arrangement is a plurality of conductor loops.

12. The device of claim 7, wherein the insulating board is at least one of a circuit board and a printed circuit board.

13. The device of claim 7, wherein the first surface and the second surface are external surfaces.

14. A system for evaluating a changing current in a planar conductor path, the system comprising:

a circuit board having a first surface and a second surface, the first surface being opposite to the second surface;

at least one planar conductor path arrangement being provided on the first surface, the changing current flowing in the at least one planar conductor path arrangement;

a planar loop arrangement being provided on the second surface, wherein a loop voltage is induced in the planar loop arrangement based on the changing current; and an arrangement for comparing the loop voltage and at least one reference voltage.

15. The system of claim 14, wherein an outside spacing of the planar loop arrangement is one of the same and about the same as a spacing of conductor paths of the at least one planar conductor path arrangement.

16. The system of claim 14, further comprising an arrangement for amplifying the loop voltage and for providing an amplified loop voltage, wherein the arrangement for comparing is used to compare the amplified loop voltage and the at least one reference voltage.

17. The system of claim 16, wherein the arrangement for amplifying is an amplifier and the arrangement for comparing is a comparator.

18. The system of claim 14, wherein the at least one reference voltage corresponds to a value of the changing current with respect to time.

19. The system of claim 14, wherein the at least one reference voltage corresponds to a maximum value of the changing current with respect to time.

20. The system of claim 14, wherein the first surface and the second surface are external surfaces.

21. A method for sensing a changing current in a planar conductor path, the method comprising the steps of:

providing an insulating board having a first surface and a second surface, the first surface being opposite to the second surface;

providing at least one planar conductor path arrangement on the first surface for a changing current; and providing a planar loop arrangement on the second surface;

inducing a loop voltage in the planar loop arrangement based on the changing current; and sensing the loop voltage.

22. The method of claim 21, wherein an outside spacing of the planar loop arrangement is one of the same and about the same as a spacing of conductor paths of the at least one planar conductor path arrangement.

23. The method of claim 21, wherein the first surface and the second surface are external surfaces.

* * * * *